United States Patent
Agarwal et al.

(10) Patent No.: US 9,286,969 B2
(45) Date of Patent: Mar. 15, 2016

(54) LOW POWER SENSE AMPLIFIER FOR STATIC RANDOM ACCESS MEMORY

(71) Applicant: GLOBALFOUNDRIES INC., Grand Cayman (KY)

(72) Inventors: Pankaj Agarwal, Bodla Agra (IN); Shiju K. Kandiyil, Bangalore (IN); Krishnan S. Rengarajan, Bangalore (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/317,806

(22) Filed: Jun. 27, 2014

(65) Prior Publication Data

US 2015/0380079 A1     Dec. 31, 2015

(51) Int. Cl.
*G11C 11/00*     (2006.01)
*G11C 11/419*    (2006.01)

(52) U.S. Cl.
CPC .................................... *G11C 11/419* (2013.01)

(58) Field of Classification Search
CPC ...................................................... G11C 11/419
USPC .......................................... 365/154, 156, 63
See application file for complete search history.

(56) References Cited

U.S. PATENT DOCUMENTS

| | | | |
|---|---|---|---|
| 755,659 A * | 3/1904 | Hathaway | H05B 3/80 219/523 |
| 4,716,320 A | 12/1987 | McAdams | |
| 5,126,970 A | 6/1992 | Ul Haq | |
| 5,323,350 A | 6/1994 | McLaury | |
| 5,491,667 A | 2/1996 | Sharp | |
| 5,557,000 A * | 9/1996 | Minemura | C08G 77/50 556/434 |
| 5,668,761 A | 9/1997 | Muhich et al. | |
| 5,729,501 A | 3/1998 | Phillips et al. | |
| 5,963,486 A | 10/1999 | Yeung et al. | |
| 6,034,909 A | 3/2000 | Brady | |
| 6,275,432 B1 | 8/2001 | Hardee | |

(Continued)

FOREIGN PATENT DOCUMENTS

JP           4593707 B2      12/2010

OTHER PUBLICATIONS

IBM, "Bit switch in semiconductor memory," An IP.com Prior Art Database Technical Disclosure, IP.com No. IPCOM000013777D, Jun. 18, 2003, 6 pages.

(Continued)

*Primary Examiner* — Viet Q Nguyen
(74) *Attorney, Agent, or Firm* — Anthony Canale; Hoffman Warnick LLC (57) ABSTRACT

A low power sense amplifier for an SRAM is described. A first pass gate transistor is driven by bit line true and a second pass gate transistor is driven by bit line complement. A first pull down transistor driven by the bit line complement is coupled to the first pass gate transistor, and a second pull down transistor driven by the bit line true is coupled to the second pass gate transistor. A data line true is coupled to a node coupling the first pass gate transistor with the first pull down transistor and a data line complement is coupled to a node coupling the second pass gate transistor with the second pull down transistor. A current cut-off device cuts off parasitic current from flowing through the first pass gate transistor and the first pull down transistor and through the second pass gate transistor and the second pull down transistor.

18 Claims, 4 Drawing Sheets

(56) References Cited

U.S. PATENT DOCUMENTS

| | | |
|---|---|---|
| 6,341,083 B1 | 1/2002 | Wong |
| 6,377,086 B1 * | 4/2002 | Bays ............... H03K 19/018521 307/412 |
| 6,515,893 B1 * | 2/2003 | Bhavnagarwala ... G11C 11/412 365/154 |
| 6,798,688 B2 | 9/2004 | Joshi |
| 7,027,346 B2 * | 4/2006 | Houston ................ G11C 7/12 365/189.09 |
| 7,061,793 B2 | 6/2006 | Barth, Jr. et al. |
| 7,130,236 B2 * | 10/2006 | Rajwani ................ G11C 7/062 365/207 |
| 7,184,343 B2 | 2/2007 | Kamata |
| 7,193,925 B2 * | 3/2007 | Hong ....................... G11C 7/08 365/230.03 |
| 7,256,621 B2 * | 8/2007 | Lih .................... H03K 19/0963 326/121 |
| 7,286,385 B2 * | 10/2007 | Barth, Jr. ................ G11C 7/02 365/205 |
| 7,522,462 B2 | 4/2009 | Edahiro et al. |
| 7,577,051 B1 * | 8/2009 | Kim ......................... G11C 7/18 365/154 |
| 7,616,511 B2 * | 11/2009 | Kim ..................... G11C 7/1048 365/189.05 |
| 7,656,723 B2 | 2/2010 | Kim et al. |
| 7,679,948 B2 | 3/2010 | Park et al. |
| 7,684,274 B2 * | 3/2010 | Rengarajan ............. G11C 7/02 365/154 |
| 7,724,565 B2 | 5/2010 | Barth, Jr. et al. |
| 7,724,586 B2 | 5/2010 | Adams et al. |
| 7,768,854 B2 | 8/2010 | Chiu et al. |
| 7,782,695 B2 | 8/2010 | Bedarida et al. |
| 7,859,921 B2 * | 12/2010 | Arsovski ................. G11C 8/16 365/156 |
| 7,898,887 B2 | 3/2011 | Dudeck et al. |
| 7,903,477 B2 * | 3/2011 | Lines ..................... G11C 5/147 365/189.09 |
| 8,045,391 B2 | 10/2011 | Mokhlesi |
| 8,144,537 B2 | 3/2012 | Mishra et al. |
| 8,223,573 B2 | 7/2012 | Koeppe et al. |
| 8,315,113 B2 | 11/2012 | Yoon |
| 8,363,497 B2 * | 1/2013 | Lee ...................... G11C 7/1048 365/203 |
| 8,462,573 B2 | 6/2013 | Choi |
| 8,472,273 B2 * | 6/2013 | Takayama ................ G11C 7/08 365/185.21 |
| 8,994,406 B2 * | 3/2015 | Chang .................. H03K 17/165 326/112 |
| 2011/0211401 A1 | 9/2011 | Chan et al. |

OTHER PUBLICATIONS

Qullette, et al. "Output Interface Circuitry for Dual-Port Static Random Access Memory that Employs a Clocked Latch-Type Sense Amplifier," An IP.com Prior Art Database Technical Disclosure, TBD v38 n7 07-95 p. 375-376, IP.com No. IPCOM000115993D, Mar. 30, 2005.

Qazi et al., A 512kb 8T SRAM Macro Operating Down to 0.57 V with an AC-Coupled Sense Amplifier and Embedded Data-Retention-Voltage Sensor in 45 nm SOI CMOS, 2011, pp. 85-96, IEEE Journal of Solid-State Circuits, vol. 46, No. 1.

Pelella et al., "A 8Kb Domino Read SRAM with Hit Logic and Parity Checker," 2005, pp. 359-362, Proceedings of ESSCIRC.

Kanj et al., "Mixture Importance Sampling and its Application to the Analysis of SRAM Designs in the Presence of Rare Failure Events," 2006, pp. 69-72, DAC.

Wicht et al., Yield and Speed Optimization of a Latch-Type Voltage Sense Amplifier, 2004, pp. 1148-1158, IEEE Journal of Solid-State Circuits, vol. 39, No. 7.

Shakir et al., Integrated Read Assist-Sense Amplifier Scheme for High Performance Embedded SRAMs, 2010, pp. 137-140, IEEE.

Rengarajan et al., "A Novel Sense Amp Circuits for SRAMs," 2009, 8 pages, Semiconductor Technology Symposium India Systems & Technology Lab.

Tran, Office Action Communication for U.S. Appl. No. 13/563,960 dated Dec. 24, 2013, 9 pages.

Tran, Andrew Q., U.S. Appl. No. 13/563,960, Notice of Allowance, Jan. 29, 2015, 5 pages.

Tran, Andrew Q., U.S. Appl. No. 13/563,960, Non-Final Office Action Dec. 26, 2014, 7 pages.

Tran, Office Action Communication for U.S. Appl. No. 13/563,960 dated Jul. 22, 2014, 9 pages.

* cited by examiner

LOW POWER SENSE AMPLIFIER FOR STATIC RANDOM ACCESS MEMORY

BACKGROUND

The present invention relates generally to integrated circuit (IC) memory devices, and more specifically, to a low power sense amplifier for a static random access memory (SRAM) device.

Contemporary memory access circuits rely on differential sense amplifiers to read small signals generated by a selected memory cell from a memory device such as an SRAM. These sense amplifiers typically use transistors configured in a cross-coupled fashion to amplify a small voltage differential created by the cell. This cross-coupled configuration of transistors is used to tolerate variation in device threshold by relying on device matching of the transistors as opposed to the absolute threshold voltages of the transistors. As semiconductor device technology continues to evolve towards providing smaller device sizes and more devices per IC (and thus smaller voltages utilized within the circuits within the IC), there is an increase in local device mismatch caused by random variation, including random dopant fluctuation and line edge roughness. One approach that has been used to reduce mismatch between transistors is by increasing the area of the cross-coupled devices. However, an increase in the area of the cross-coupled devices increases switching current and leakage. Higher leakage also degrades performance of the SRAM.

SUMMARY

In one embodiment, there is a circuit that comprises a first pass gate transistor driven by a signal derived from bit line true associated with a static random access memory (SRAM) cell and a second pass gate transistor driven by a signal derived from bit line complement associated with the SRAM cell. A first pull down transistor is driven by the signal derived from the bit line complement and coupled to the first pass gate transistor. A second pull down transistor is driven by the signal derived from the bit line true and coupled to the second pass gate transistor. A data line true is coupled to a node coupling the first pass gate transistor with the first pull down transistor, wherein the data line true is isolated from the bit line true by the first pass gate transistor. A data line complement is coupled to a node coupling the second pass gate transistor with the second pull down transistor, wherein the data line complement is isolated from the bit line complement by the second pass gate transistor. A current cut-off device cuts off parasitic current from flowing through one of a first path formed from the first pass gate transistor and the first pull down transistor and a second path formed from the second pass gate transistor and the second pull down transistor.

In a second embodiment, there is a sense amplifier for a static random access memory (SRAM) cell. In this embodiment, the sense amplifier comprises a first pass transistor configured to pass data that is on a signal derived from a bit line true associated with the SRAM cell. A second pass transistor is configured to pass data that is on a signal derived from a bit line complement associated with the SRAM cell. A first pass gate transistor is configured to be driven by the data that is on the signal derived from the bit line true passing through the first pass transistor. A second pass gate transistor is configured to be driven by the data that is on the signal derived from the bit line complement passing through the second pass transistor. A first pull down transistor is driven by the data that is on the signal derived from the bit line complement and coupled to the first pass gate transistor. A second pull down transistor is driven by the data that is on the signal derived from the bit line true and coupled to the second pass gate transistor. A data line true is coupled to a node coupling the first pass gate transistor with first pull down transistor, wherein the data line true is isolated from the bit line true by the first pass gate transistor. A data line complement is coupled to a node coupling the second pass gate transistor with the second pull down transistor, wherein the data line complement is isolated from the bit line complement by the second pass gate transistor. A current cut-off device is configured to cut off parasitic current from flowing through one of a first path formed from the first pass gate transistor and the first pull down transistor and a second path formed from the second pass gate transistor and the second pull down transistor during an amplification state.

In a third embodiment, there is a memory circuit. In this embodiment, the memory circuit comprises a memory array including a plurality of memory cells. At least one sense amplifier is connected to the memory array for selectively reading a logic state of at least one of the memory cells in the memory array. The at least one sense amplifier comprises a pair of inverter devices each controlled oppositely by a pair of complementary bit lines associated with the at least one of the memory cells in the memory array. The at least one sense amplifier further comprises a pair of complementary data lines each corresponding with one of the complementary bit lines. Each of the complementary data lines is coupled to one of the pair of inverter devices, wherein each of the complementary data lines is isolated from the corresponding bit line. The at least one sense amplifier further comprises a current cut-off device that is configured to cut off parasitic current from flowing through one of one of the pair of inverter devices during an amplification state.

DETAILED DESCRIPTION

Figure 1:
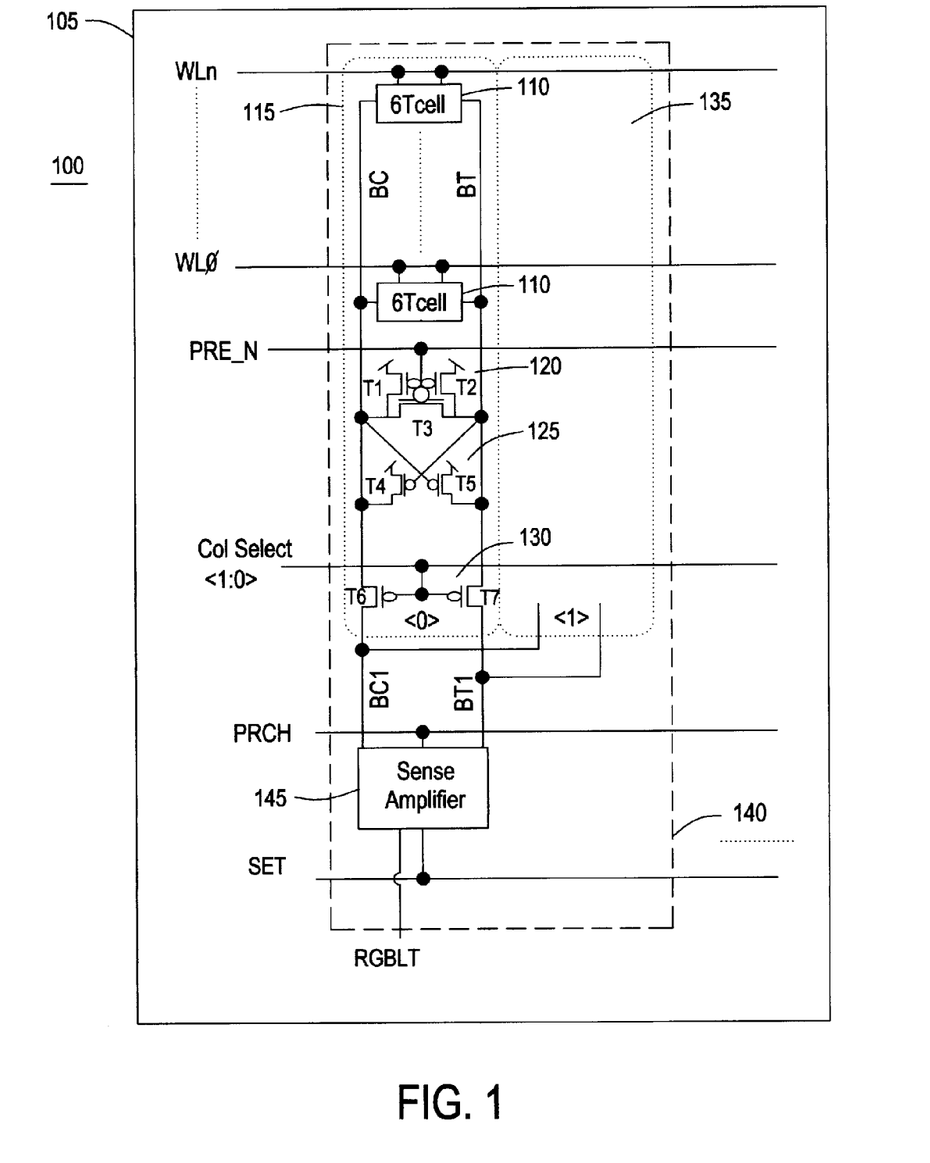
FIG. 1 shows a schematic of a memory circuit according to one embodiment of the present invention.

Referring to FIG. 1, there is a schematic of a memory circuit 100 according to one embodiment of the present invention. In particular, FIG. 1 shows a portion of a memory array 105 formed from memory cells 110 in which bits of data are stored. For ease of illustration, FIG. 1 shows only one column 115 of memory cells 110, however, memory array 105 would have a multiple of memory cells 110 arranged in each of its rows and columns. In one embodiment, memory array 105 can take the form of a static random access memory (SRAM). Although the description that follows for memory array 105 is directed to an SRAM, those skilled in the art will recognize that embodiments described below are also suited for use with other memory devices such as a dynamic RAM (DRAM).

Each SRAM cell 110 is capable of storing a binary voltage value that represents a logical data bit (e.g., "0" or "1"). One existing configuration for SRAM cell 110 can include a balanced pair of cross-coupled devices such as inverters that store a single data bit. The inverters act as a latch that stores the data bit therein, so long as power is supplied to memory array 105. A pair of pass gates (e.g., a balanced pair of field-effect transistors (FETs)) selectively connects complementary outputs of the cross-coupled inverters to a corresponding complementary or differential pair of bit lines (e.g., a bit line true (BT) and a bit line complement (BC)) that are used to write or read from cell 110 upon being put in a particular logic state. A word line (WL0 . . . WLn) connected to the gates of the pass gate FETs selects the cell 110 to the corresponding complementary pair of bit lines for performing an operation that may include a read or a write operation.

As an example, FIG. 1 shows that cell 110 can take the form of a six-transistor (6T) cell, wherein the pair of access transistors or pass gates (when activated by word line (WL0 . . . WLn) selectively couples the pair of cross-coupled inverters to the pair of complementary bit lines (i.e., a bit line true BT and a bit line complement BC). Those skilled in the art will appreciate that other SRAM cell designs using a different number of transistors (e.g., 4T, 8T, etc.) can be used for cell 110.

FIG. 1 further shows that memory array 105 can further include a cell precharge and equalization device 120 that can be formed from P-type field effect transistors (PFET) T1, T2 and T3 and controlled by signal PRE_N. Transistors T1 and T2 form the precharge aspect of device 120, while transistor T3 forms the equalization aspect. Precharge devices T1 and T2 are used to charge bit line true BT and bit line complement BC to a precharged level or a "ready" state to read data after initially being in a "stand-by" state waiting for a command. In one embodiment, precharge devices T1 and T2 can charge bit line true BT and bit line complement BC to "high". In another embodiment, precharge devices T1 and T2 can charge bit line true BT and bit line complement BC to another level (e.g., between high and "low"). During the precharge operation, equalization device T3 equalizes bit line true BT and bit line complement BC in order to remove or cancel any offset that may exist between these bit lines.

After being precharged, the inverters of cell 110 are ready to read data along bit line true BT and bit line complement BC. In particular, after being precharged, bit line true BT and bit line complement BC are released from the voltage reference. When bit line true BT and bit line complement BC are released from the precharged voltage level, the inverters of cell 110 are then connected to one of the bit lines upon a word line WL activating that particular cell. Once connected, there is a charge-sharing that occurs with the storage cell 110 and one of bit line true BT and bit line complement BC via capacitors (not shown). A result of this charge sharing is that the charge in cell 110 and the charge in one of bit line true BT and bit line complement BC will change, leaving a voltage differential with the other bit line not taking part in the charge sharing.

Memory array 105 can further include a pair of cross-coupled pull-ups 125 that can be formed from PFETs T4 and T5 that keep the one bit line high while the other goes low. This facilitates a clear differential between bit line true BT and bit line complement BC. As shown in FIG. 1, transistors T4 and T5 are cross-coupled such that the gate of transistor T4 is coupled to bit line true BT, while the gate of transistor T5 is coupled to bit line complement BC. In operation, if bit line true BT goes low then transistor T4 turns on, pulling bit line complement BC high. Even though bit line complement BC is already high because of the precharging, it is kept high by turning on transistor T4 and will not drift down due to the effects of noise.

Although not illustrated in FIG. 1, those skilled in the art will appreciate that memory array 105 could have N-type FETs (NFETs) coupled to bit line true BT and bit line complement BC for facilitating writing operations. In addition, there would be other devices in memory array 105 to facilitate writing such as a write driver. For clarity in describing the various embodiments of the present invention these devices are not shown.

Memory array 105 can further include a pair of bit switch devices 130 formed from PFETs T6 and T7 that are used to select the particular column that cell 110 occupies in memory array 105. As shown in FIG. 1, column 115 is denoted as <0>, while another column 135 in a slice 140 of memory array 105 is denoted as <1>. Note that for clarity, column 135 is empty but it would be a mirror of column 115. In operation, columns 115 and 135 denoted by <0> and <1>, respectively, would be selected by the Col Select signal. In particular, the Col Select signal selects bit switch devices 130 formed from transistors T6 and T7 in order to connect bit line true BT and bit line complement BC to nodes containing corresponding bit lines, bit line true BT1 and bit line complement BC1, respectively.

Bit line true BT1 and bit line complement BC1 connect to sense amplifier 145 which amplifies the voltage differential on the bit lines. As shown in FIG. 1, sense amplifier 145 is controlled by a SET signal and a precharge signal PRCH. In operation, when enough of a signal has been developed on bit line true BT and bit line complement BC, sense amplifier 145 is turned on by the SET signal. The signal on line true BT and bit line complement BC is then transferred to bit line true BT1 and bit line complement BC1, and supplied to sense amplifier 145 for amplification. Sense amplifier 145 outputs the amplified voltage differential along a pair of complementary data lines (data line true DLT and data line complement DLC which are not shown in FIG. 1) each corresponding respectively with one of the complementary bit lines (line true BT1 and bit line complement BC1). Sense amplifier 145 can then convert the amplified voltage differential that is present on the data lines to a single ended signal that is denoted in FIG. 1 as signal RGBLT.

Figure 2:
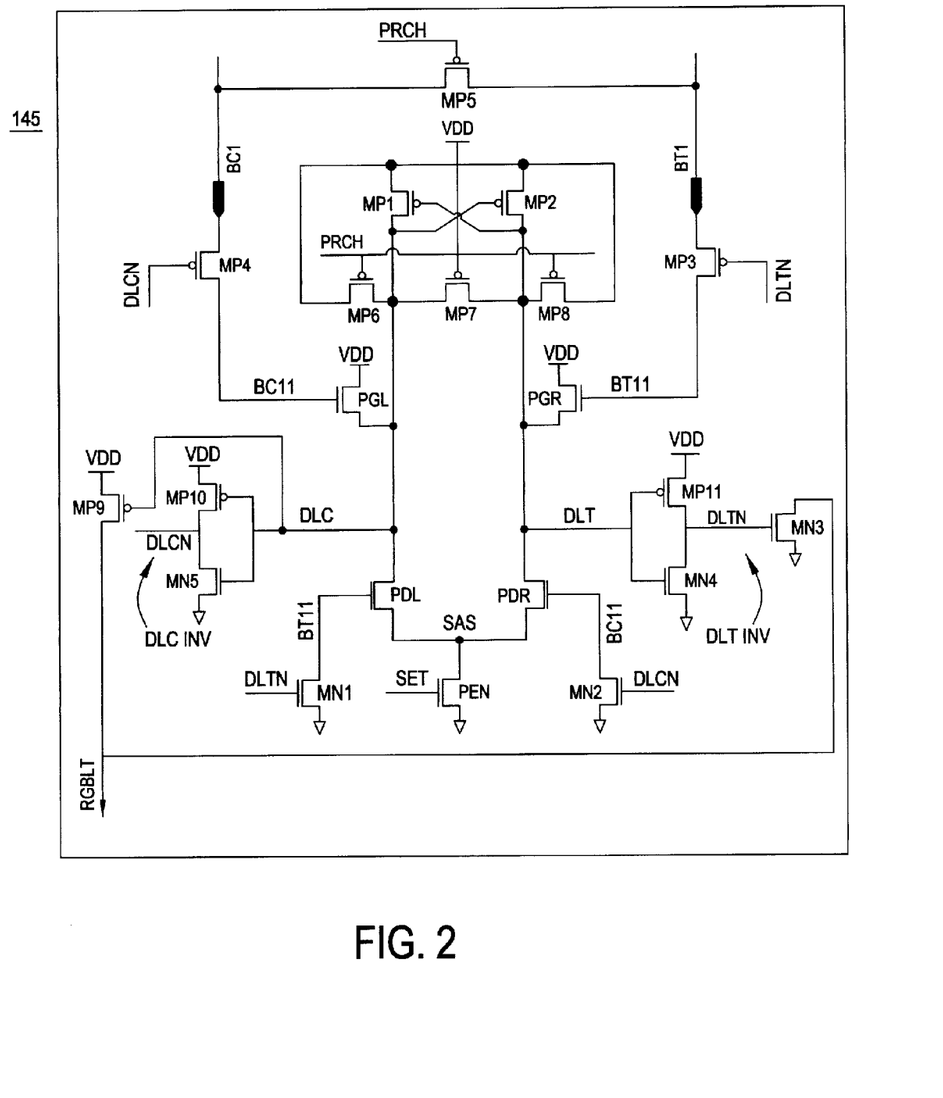
FIG. 2 shows a more detailed schematic view of a sense amplifier depicted in FIG. 1 according to one embodiment of the present invention.

FIG. 2 shows a more detailed schematic view of sense amplifier 145 depicted in FIG. 1 according to one embodiment of the present invention. As shown in FIG. 2, sense amplifier 145 can include PFET pass transistors MP3 and MP4. Transistor MP3 is configured to receive data that is on bit line true BT1 of the memory cell and pass it onto a corresponding bit line true BT11, which like bit line true BT1 is a signal derived from bit line true. Similarly, transistor MP4 is configured to receive data that is on bit line complement BC1 and pass it onto a corresponding bit line complement BC11, which like bit line complement BC1 is a signal derived from bit line complement. Pass transistors MP3 and MP4 form an isolation device as these transistors can serve to physically isolate bit line true BT1 and bit line complement BC1 from the inputs of the sense amplifier 145 once the sense amplifier outputs DLT/DLC are amplified. Note that the sense amplifier would be turned on with the SET signal going high only once sufficient signal is available on its inputs. In addition, as explained below, transistors MP3 and MP4 are part of a current cut-off device that facilitates reduced power consumption by sense amplifier 145 as they save power on the bit lines.

Sense amplifier 145 can further include a PFET equalization device MP5 that is controlled by the PRCH signal. Equalization device MP5 can serve to equalize bit line true BT1 and bit line complement BC1 into a steady state. In one embodiment, equalization device MP5 at the direction of the PRCH signal can equalize bit line true BT1 and bit line complement BC1 upon completing a read operation when bit switch 130 (FIGS. 1-T6 and T7) disconnects the bit lines. Equalizing bit line true BT1 and bit line complement BC1 upon completing a read operation in combination with any precharge of bit lines BT and BC performed by transistors T1 and T2 of precharge device 120 (FIG. 1) ensures that the lines are at a suitable operating point with no offset therebetween (equalization device MP5 is off during the read cycle). Otherwise, improper equalization of bit line true BT 1 and bit line complement BC 1 and precharging of bit lines BT and BC may lead to mismatch issues when a read cycle starts.

As shown in FIG. 2, bit line true BT11 drives a pass gate transistor PGR (an NFET) and a pull down transistor PDL (an NFET), while bit line complement BC 11 drives a pass gate transistor PGL (an NFET) and a pull down transistor PDR (an NFET). In particular, bit line true BT11 is coupled to a gate of pass gate transistor PGR and a gate of pull down transistor PDL, while bit line complement BC11 is coupled to a gate of pass gate transistor PGL and a gate of pull down transistor PDR.

FIG. 2 further shows that pull down transistor PDL can be coupled to pass gate transistor PGL, while pull down transistor PDR can be coupled to the pass gate transistor PGR. In one embodiment, a drain of pass gate transistor PGL and a drain of pass gate transistor PGR can be coupled to a supply voltage VDD, while a source of transistor PGL and a source of PGR can be coupled to a drain of pull down transistor PDL and a drain of pull down transistor PDR, respectively. As a result, a cross-coupled configuration is formed from driving the gate of pull down transistor PDL with bit line true BT11 and driving the gate of pull down transistor PDR with bit line complement BC 11. In this manner, pass gate transistor PGL and first pull down transistor PDL, and pass gate transistor PGR and pull down transistor PDR form a pair of inverter devices (PGL and PDL; and PGR and PDR) each controlled oppositely by a pair of complementary bit lines (bit line true BT11 and bit line complement BC11).

The aforementioned pair of complementary data lines that correspond with the pair of complementary bit lines provided to the sense amplifier are coupled to the pair of inverter devices formed from PGL and PDL, and PGR and PDR. In FIG. 2, data line DLT can be coupled to a node that couples pass gate transistor PGR with pull down transistor PDR, while data line complement DLC can be coupled to a node that couples pass gate transistor PGL with pull down transistor PDL. In this manner, data line true DLT is isolated from the bit line true BT11 by pass gate transistor PGR, while data line complement DLC is isolated from bit line complement BC 11 by the pass gate transistor PGL.

In order to reduce mismatches, the various embodiments of the present invention may use floating body devices for the pair of inverter devices (PGL and PDL; and PGR and PDR). Although a floating body device can suffer from history effects, the implementation of the various embodiments of the present invention provides isolation of data line true DLT and data line complement DLC from bit line true BT1 and bit line complement BC1, respectively, to provide gains from common mode issues, and facilitate a yield of memories. Furthermore, the isolation of bit line true BT and bit line complement BC from downstream circuits reduces noise effects due to leakage paths, giving a good signal on the bit lines. It is further noted that this isolation also reduces the load on the bit lines. By isolating the sense amplifier from the bit lines, the detrimental effect of leakage through the sense circuit on bit line signal development is eliminated.

FIG. 2 shows that sense amplifier 145 can further include a data line precharge and equalization device formed from PFET transistors MP6, MP7 and MP8. As shown in FIG. 2, transistors MP6, MP7 and MP8 are connected in series with their gates driven by the PRCH signal. In this manner, transistors MP6, MP7 and MP8 can precharge and equalize data line true DLT and data line complement DLC. In one embodiment, the drains of MP6 and MP8 can be coupled along a node that connect to data line complement DLC and data line true DLT, respectively, while the drain and source of transistor MP7 can be coupled to a node that connects to data line complement DLC and data line true DLT, respectively. In this manner, transistors MP6 and MP8 can be used to precharge data line complement DLC and data line true DLT, while transistor MP7 can be used to equalize the data lines.

Generally, the precharge and equalization of data line true DLT and data line complement DLC occurs before a read cycle is initiated. Once a read cycle is initiated, data line true DLT and data line complement DLC are released from the precharge and equalization operation. Once a word line turns on a particular cell, the complementary pair of bit lines will start to develop a signal in the manner described above (i.e., one of the bit lines (e.g., bit line true) goes low while the other bit line (i.e., bit line complement) will stay high). At an appropriate time (e.g., when enough of a signal has developed on the bit lines), sense amplifier 145 will turn on and amplify the signal on the bit lines, resulting in larger differential placed on data line true DLT and data line complement DLC.

As shown in FIG. 2, sense amplifier 145 can further include a pair of cross-coupled PFET transistors MP1 and MP2 coupled to nodes connecting with data line true DLT and data line complement DLC. In one embodiment, the pair of transistors MP1 and MP2 can have their gates cross-coupled with the drains of the opposing transistors. For example, the drain of transistor MP1 can be coupled to the gate of transistor MP2, while the drain of transistor MP2 can be coupled to the gate of transistor MP1. Data line complement DLC and data line true DLT can be connected along the nodes that couple the drains of transistors MP1 and MP2, respectively. The sources of transistors MP1 and MP2 can connect to supply voltage VDD. Generally, cross-coupled transistors MP1 and MP2 on data line complement DLC and data line true DLT can aid in keeping the high-side of the data lines high, turning on only after initial amplification. In addition, transistors MP1 and MP2 can work in conjunction with data line precharge and equalization devices MP6, MP7 and MP8 to facilitate the precharging of data line complement DLC and data line true DLT.

Sense amplifier 145 can further include an NFET set device PEN that is coupled to pull down transistor PDL and pull down transistor PDR along the SAS node which is the common source node. In one embodiment, the drain of the PEN transistor can be coupled to the SAS node. In this manner, the PEN transistor can be controlled by the SET signal to pull down transistor PDL and pull down transistor PDR to operate in an amplification state. For example, the SET signal can drive set device PEN to operate in an amplification state during a read operation.

FIG. 2 shows that sense amplifier 145 can include a data line true inverter DLT INV that inverts data line true DLT and a data line complement inverter DLC INV that inverts the data line complement DLC. The data line true inverter DLT INV includes a PFET MP11 and an NFET MN4. Transistor MP11 is coupled to the supply voltage VDD while the transistor MN4 is coupled to ground. A node coupling transistors MP11 and MN4 forms an inverted data line true DLTN. The data line complement inverter DLC INV includes a PFET MP 10 and an NFET MN5. Transistor MP 10 is coupled to the supply voltage VDD while the transistor MN5 is coupled to ground. A node coupling transistors MP10 and MN5 forms an inverted data line complement DLCN.

As shown in FIG. 2, data on the inverted data line true DLTN and the inverted data line complement DLCN can control the isolation device formed from pass transistors MP3 and MP4. In one embodiment, the inverted data line true DLTN can drive pass transistor MP3, while the inverted data line complement DLCN can drive pass transistor MP4. In this manner, pass transistor MP3 can pass data on bit line true BT1 from the memory cell to bit line true BT11 when the inverted data line complement DLTN is low. Similarly, pass transistor MP4 can pass data on bit line complement BC1 to bit line complement BC11 when the inverted data line complement DLCN is low.

The inverted data line true DLTN and the inverted data line complement DLCN can also control a bit line true pull down transistor formed from NFET MN1 and a bit line complement pull down transistor formed from NFET MN2, respectively. As explained below in more detail, bit line true pull down transistor MN1 and bit line complement pull down transistor MN2 form part of a current cut-off device that can cut off parasitic current from flowing during an amplification state through a first path that includes supply voltage VDD, transistor PGL, transistor PDL, transistor PEN and ground or a second path that includes supply voltage VDD, transistor PGR, transistor PDR, transistor PEN and ground, respectively. Simultaneously, transistors MP3 and MP4 can cut off bit line true BT11 and bit line complement BC11, respectively, to the associated bit line which precludes the discharging bit line in the memory array from swinging any more. By isolating the sense amplifier from the bit lines in this manner, the detrimental effect of leakage through the sense circuit on bit line signal development is eliminated. Those skilled in the art will appreciate that transistors MN1 and MN2, although provide a path to ground from the bit lines can be sized very small and thus will contribute only negligibly to leakage on the bit lines.

Sense amplifier 145 can further include a differential to single ended signal (DTS) converter that receives data from the data line true inverter DLT INV and the data line complement inverter DLC INV as input and generates a single output RGBLT therefrom. In one embodiment, the D2S converter can be implemented to include an NFET MN3 and a PFET MP9. As shown in FIG. 2, transistor MN3 can be driven by the inverted data line true DLTN while transistor MP9 can be driven by data line complement DLC. In this configuration, the output RGBLT is a function of the polarity or state on data line true DLT and data complement DLC. For example, if data complement DLC is low and data line true DLT is high, then the RGBLT signal is high. Conversely, if data complement DLC is high and data line true DLT is low, then the RGBLT signal is low.

As an example illustrating the operation of the D2S converter, consider again the scenario where data line complement DLC is low and data line true DLT is high. In this example, data line true inverter DLT INV inverts data on data line true DLT so that the inverted data line true DLTN becomes low keeping transistor MN3 off. A low for data line complement DLC will turn on transistor MP9, which pulls RGBLT to supply voltage VDD. A high at output RGBLT corresponds to the high polarity on DLT.

This D2S converter formed from the configuration of transistors MN3 and MP9 is only an example of one possible D2S converter. Those skilled in the art will appreciate that there are other designs of a D2S converter that could be used with sense amplifier 145. Thus, this D2S converter is not meant to limit the scope of the various embodiments described herein. Furthermore, those skilled in the art will appreciate that the D2S converter can be a separate component that is not part of sense amplifier 145.

As mentioned above, bit line true pull down transistor MN1 and bit line complement pull down transistor MN2 can operate to cut off parasitic current from flowing during an amplification state through a first path that includes supply voltage VDD, transistor PGR, transistor PDR, transistor PEN and ground or a second path that includes supply voltage VDD, transistor PGL, transistor PDL, transistor PEN and ground, respectively. Without having a current cut-off device like that provided by the bit line true pull down transistor MN1 and the bit line complement pull down transistor MN2, sense amplifier 145 will have a shoot-through current or parasitic current that flows from the supply voltage VDD to ground during the whole time that the sense amplifier is amplifying the output of the memory cell. In particular, this parasitic current could flow from the supply voltage VDD, transistor PGR, transistor PDR, transistor PEN and ground or from the supply voltage VDD, transistor PGL, transistor PDL, transistor PEN and ground during amplification. This parasitic current results in power consumption which allows the sense amplifier to operate at a lower power.

Also, the use of isolation transistors MP3 and MP4 in the current cut-off device, also contribute to minimizing the adverse effects of leakage in the sense amplifier. Without having a current cut-off device like that also employs isolation devices MP3 and MP4, the sense amplifier can have leakage through its sense circuit which will have a detrimental effect on bit line signal development.

Various embodiments of the present invention can obviate this parasitic current through the use the bit line true pull down transistor MN1 and the bit line complement pull down transistor MN2 and transistors MP3 and MP4. In particular, bit line true pull down transistor MN1 and the bit line complement pull down transistor MN2 can shut-off or cut-off this parasitic current between the supply voltage VDD and ground through the above-noted paths as soon as the sense amplifier 145 amplifies the output from the memory cell. Simultaneously, transistors MP3 and MP4 can cut off bit line true BT11 and bit line complement BC 11, respectively, to the associated bit line which precludes the discharging bit line in the memory array from swinging any more, eliminating the effect of leakage through the sense circuit on bit line signal development.

To illustrate how the current cut-off device provided by the bit line true pull down transistor MN1 and the bit line complement pull down transistor MN2 can operate to shut off the parasitic current from one these two paths, consider a read operation scenario after the bit lines have been equalized and precharged, where the bit lines are released so that one bit line is discharged while the other line is kept high. As an example of operation, consider the scenario where bit line BT in a particular memory cell that has been activated by the word line goes low, while bit line complement BC stays high.

The bit switch devices 130 of FIG. 1 can connect bit line BT and bit line complement BC to the sense amplifier 145 via bit line BT1 and bit line complement BC1, respectively. As noted above, when enough of a signal has developed on bit line true BT and bit line complement BC, sense amplifier 145 is turned on by the SET signal. The signals on line true BT and bit line complement BC are then transferred to bit line true BT1 and bit line complement BC1 by the bit switch devices 130, making them ready for amplification by the sense amplifier 145.

Before the sense amplifier 145 is turned on by the SET signal, data line true DLT and data line complement DLC have been equalized and precharged by applying the PRCH signal to transistors MP6, MP7 and MP8. Once the read cycle has been initiated, data line true DLT and data line complement DLC are released from the precharge and equalization operation. Since data line true DLT and data line complement DLC are precharged, the inverted data line true DLTN and inverted data line complement DLCN will be low turning on transistors MP3 and MP4, respectively. This enables transistor MP3 to apply bit line true BT11 to the pass gate transistor PGR and the pull down transistor PDL, while transistor MP4 applies bit line complement BC 11 to the pass gate transistor PGL and the pull down transistor PDR.

In this example, since the signal on bit line complement BC11 will be high and the signal on bit line true BT11 will be low, BC11 will maintain data line complement DLC high via pass gate transistor PGL, while BT11 will keep pass gate transistor PGR off, and thus data line true DLT at low. The pull-up transistors formed from transistors MP 1 and MP2 will also maintain data line complement DLC at high and data line true DLT at low due to its cross-coupled configuration.

Set transistor PEN when activated by the SET signal will pull bit line true BT 11 lower during the amplification due to its configuration with ground. In addition, bit line true BT11 will be kept all the way low since the inverted data line true DLTN will be high turning on pull down transistor MN1, which is pulled down to ground. A low bit line true BT11 will keep pull down transistor PDL off, thereby shutting off the path for the parasitic current through transistors PDL and the set transistor PEN. Since bit line complement BC11 is high and the inverted bit line complement DLCN is low in this example, the pull down transistor PDR will be on while pull down transistor MN2 will be off. As a result, current along the data line true DLT will be sunk through pull down transistor PDR and the set transistor PEN via the SAS node. Note that there may be some current through pull down transistor PDL, however, it will be pulled down to the set transistor PEN via the SAS node. In any event, the sum of the path current through pull down transistor PDR and pull down transistor PDL is sunk into ground via the set transistor PEN. Removing these parasitic current paths in sense amplifier 145, as well leakage that has been obviated by the use of transistors MP3 and MP4, the sense amplifier can operate at a lower power since power consumption.

The aforementioned description is also applicable to a scenario in which bit line true BT stays high and bit line complement BC goes low. In this case, pull down transistor MN1 will be off and pull down transistor MN2 will be on. As a result, the path for the parasitic current through transistors PDR and the set transistor PEN will be shut off. Furthermore, current along the data line complement DLC will be sunk through pull down transistor PDL and the set transistor PEN via the SAS node. Again, shutting of the parasitic current paths enables sense amplifier to operate at a lower power since power consumption due to the parasitic current has been obviated.

In addition to lowering power consumption by cutting off parasitic current, the configuration of FIG. 2 enables sense amplifier 145 to operate at lower voltages as compared to conventional sense amplifier that do not use such a current cut-off device. In particular, the use of the pass transistors MP3 and MP4 to isolate bit line true BT1 and bit line complement BC1 from the data line true DLT and data line complement DLC, respectively, enables sense amplifier 145 to operate at lower voltages because any common mode issues can be obviated. That is, pass transistors MP3 and MP4 can operate in conjunction with pass gate transistors PGR and PGL to obviate common mode issues by allowing one of the data lines to not go below a certain voltage level during development of a signal. Isolating the bit lines through transistor MP3 and transistor MP4 helps the sense amplifier 145 to respond quicker and prevents the bit lines from being amplified by the sense amplifier. The use of transistors PGR and PGL helps curtail the response of the bit line that is higher to common mode noise, thereby improving the robustness of the sense amplifier.

Figure 3:
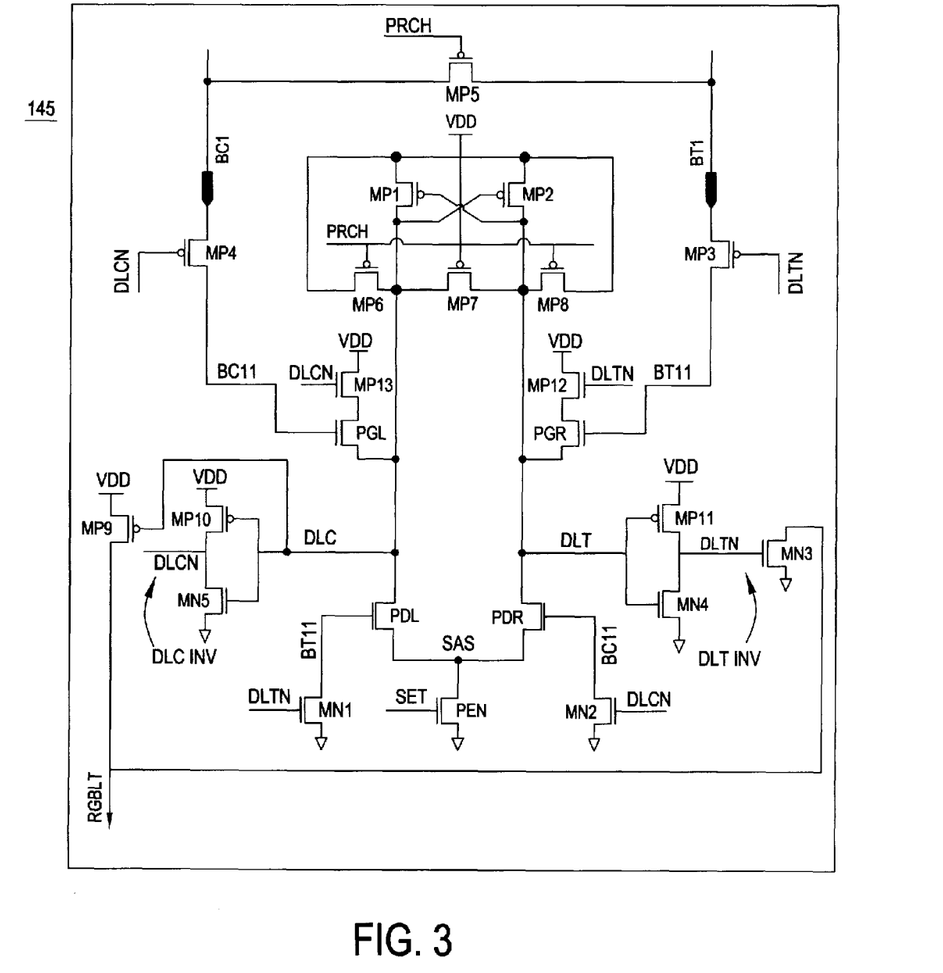
FIG. 3 shows a more detailed schematic view of a sense amplifier according to an alternative embodiment of the present invention.

FIG. 3 shows a more detailed schematic view of sense amplifier 145 according to an alternative embodiment of the present invention. FIG. 3 differs from FIG. 2 in that the current cut-off device includes additional components to cut-off the parasitic current that could flow through a path that can include the supply voltage VDD, transistor PGR, transistor PDR, transistor PEN and ground, or a path that can include the supply voltage VDD, transistor PGL, transistor PDL, transistor PEN and ground during amplification. As shown in FIG. 3, a PFET pass gate current cut-off transistor MP12 can be coupled in series with pass gate transistor PGR and a PFET pass gate current cut-off transistor MP13 can be coupled in series with pass gate transistor PGL. Pass gate current cut-off transistor MP12 can be driven by the inverted data line true DLTN, while pass gate current cut-off transistor MP13 can be driven by the inverted data line complement DLCN. In operation, pass gate current cut-off transistor MP12 and pass gate current cut-off transistor MP13 can cut-off or clamp current from flowing from supply voltage VDD to pass gate transistor PGR, and from supply voltage VDD to pass gate transistor PGL, respectively. Cutting off this current in either one of these paths enables data line true DLT and data line complement DLC to go lower when one of these lines is driven low.

To illustrate how pass gate current cut-off transistor MP12 and pass gate current cut-off transistor MP 13 can operate to cut-off parasitic current in sense amplifier 145, consider again the scenario where bit line BT goes low and bit line complement BC stays high. As mentioned above, in this scenario, data line true inverter DLT INV will invert data on data line true DLT to a low on inverted data line true DLTN, while data line complement inverter DLC INV will inverts data on data line complement to a high on inverted data line complement DLCN. A high on inverted data line true DLTN keeps pass gate current cut-off transistor MP12 off, thereby clamping the current from flowing from supply voltage VDD to pass gate transistor PGR. During the clamping of the current, pass gate current cut-off transistor MP13 will be on because inverted data line complement DLCN is low. This keeps the current path from supply voltage VDD through pass gate transistor PGL intact. However, this parasitic current path that continues from pass gate transistor PGL through pull down transistor PDL and set transistor PEN will be cut-off as pull down transistor MN1 pulls bit line true BT11 down to ground. As explained above, a low bit line true BT11 will keep pull down transistor PDL off, which shuts off the path for the parasitic current through transistors PDL and the set transistor PEN. In addition, the pull down transistor PDR will be on since bit line complement BC11 is high in this example. As a result, current along the data line true DLT will be sunk through pull down transistor PDR and the set transistor PEN via the SAS node. Also, during this time transistors MP3 and MP4 can cut off bit line true BT11 and bit line complement BC 11, respectively, to the associated bit line precludes the discharging bit line in the memory array from swinging any more, thereby eliminating adverse effects of leakage through the sense circuit on bit line signal development.

In a scenario where bit line true BT stays high and bit line complement BC goes low, data line complement inverter DLC INV will invert data on data line complement DLC to a high on inverted data line complement DLCN, while data line true inverter DLT INV will inverts data on data line true to a low on inverted data line true DLTN. A high on inverted data line complement DLCN keeps pass gate current cut-off transistor MP13 off, thereby clamping the current from flowing from supply voltage VDD to pass gate transistor PGL. Pass gate current cut-off transistor MP12 will be on because inverted data line true DLTN is low. This keeps the current path from supply voltage VDD through pass gate transistor PGR intact. The parasitic current path that continues from pass gate transistor PGR through pull down transistor PDR and set transistor PEN will be cut-off as pull down transistor MN2 pulls bit line complement BC11 down to ground. A low bit line complement BC11 will keep pull down transistor PDR off, which shuts off the path for the parasitic current through transistors PDR and the set transistor PEN. The pull down transistor PDL will be on since bit line true BT11 is high in this example. This causes current along the data line complement DLC to be sunk through pull down transistor PDL and the set transistor PEN via the SAS node.

Generally, in the embodiment illustrated in FIG. 3, inverted data line true DLTN and inverted data line complement DLCN are used primarily to cut off current through a path that can include supply voltage VDD, transistor PGR, transistor PDR and transistor PEN, and a path that can include supply voltage VDD, transistor PGL, transistor PDL and transistor PEN. This differs from the embodiment illustrated in FIG. 2 in that bit line true BT11 and bit line complement BC 11 are use to cut off the current through these paths. Both approaches will be effective in reducing power consumption with the approach in FIG. 3 costing slightly more in DC power in comparison to the embodiment illustrated in FIG. 2. However, the approach in FIG. 2 will save in layout area in comparison to the configuration of FIG. 3 since pass gate current cut-off transistor MP12 and pass gate current cut-off transistor MP13 are not utilized.

Figure 4:
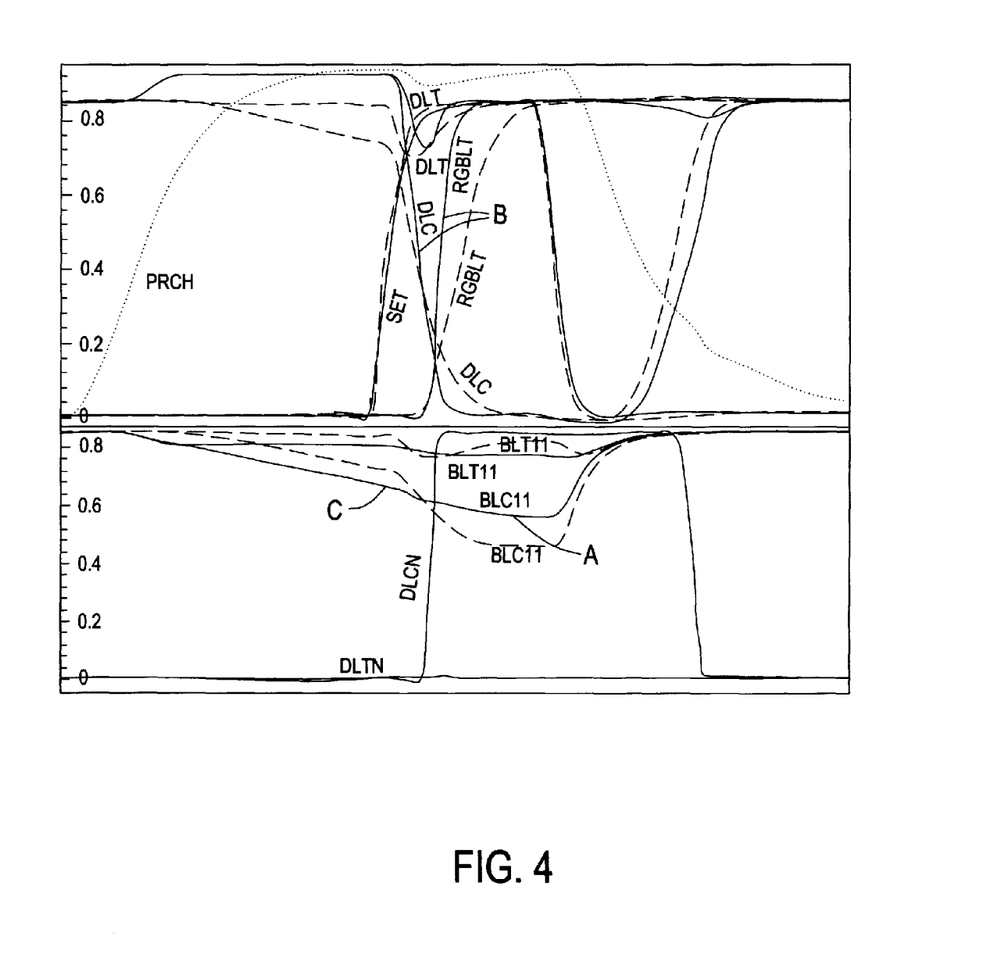
FIG. 4 shows a simulation of the operation of the sense amplifiers depicted in FIGS. 2-3 to a sense amplifier that does not utilize a current cut-off device to shut off parasitic current like those described in the various embodiments of the present invention.

FIG. 4 shows a simulation of the operation of the sense amplifiers depicted in FIGS. 2-3 to a sense amplifier that does not utilize a current cut-off device to shut off parasitic current like that of the various embodiments described herein. In FIG. 4, operation of the sense amplifier that utilizes one of the current cut-off device embodiments described herein is illustrated with solid lines while operation of the sense amplifier that does not utilize a current cut-off device is illustrated with dashed lines. Note that the signal PRCH is represented as a dotted line since it is similar to both sense amplifiers.

In the simulation of FIG. 4, bit line true BT stays high while bit line complement BC goes low. As shown in the bottom half of FIG. 4, bit line true BT11 and bit line complement BC11 are close together prior to charge sharing taking place. Upon charge sharing, bit line true BT11 stays high while bit line complement BC11 goes low. When the SET signal turns on (goes high), the sense amplifiers turn on causing them to amplify the voltage differential between bit line true BT11 and bit line complement BC11.

Before charge sharing takes place between bit line true BT11 and bit line complement BC11, the PRCH signal is initiated. This facilitates the precharging and equalizing of data line true DLT and data complement DLC. During the amplification, data line true DLT stays high while data complement DLC goes low.

Once the amplification happens, the RGBLT signal is targeted causing the D2S converter to generate a single ended signal output. Note that the RGBLT signal goes high when data line true DLT and data complement DLC are amplified. Once the D2S converter generates the output signal (single output signal will be high corresponding to DLT being high), then the read cycle starts to finish up causing data line true DLT and data complement DLC and bit line true BT11 and bit line complement BC11 to converge where they are subsequently equalized to remove any offset. Note that sense amplifiers turn off as the SET signal transitions to low.

As illustrated in FIG. 4, the sense amplifier that uses a current cut-off device according to one of the embodiments described herein will consume less power than if the sense amplifier did not utilize a current cut-off device to cut off parasitic current paths from the supply voltage to ground. In particular, the simulation of FIG. 4 shows at reference point A that bit line BC11 uses less power for the sense amplifier according to one of the embodiments described herein as compared to the sense amplifier that does not utilize a current cut-off device. Reference point A refers to the instance at which one of the current cut-off devices (e.g., transistor MN2) is turned on pulling down bit line BC11. At this instance, BC11 for the sense amplifier of embodiments described herein does not goes as low as the sense amplifier that does not utilize the current cut-off device, thereby using less power.

The simulation of FIG. 4 also shows that the sense amplifier according to the various embodiments of the present invention is able to attain crisper signals and less swing in signals in comparison to the sense amplifier that does not use a current cut-off device. In particular, reference point B shows an instance where crisper signals are attained and reference point C shows an instance where less swing on the signals are attained. With regard to reference point B, the simulation shows that RGBLT rises quicker for embodiments of the present invention that use a current cut-off device as compared to a sense amplifier that does not use such a device. Similarly, reference point B shows that data line complement DLC falls quicker for the various embodiments of the present invention. Crisper signals mean that the window for which they are active (e.g., DLC low period in FIG. 4) will be well defined, and therefore, the circuit performance will be robust even at very slow process models and low supply voltages. This gives an opportunity to improve performance by reducing the active windows. With regard to less swing on the signals, reference point C shows that there is less swing on the bit lines. This is generally achieved by isolating the bit lines BT and BC from sense amplifier 145. In a sense amplifier that does not utilize a current cut-off device as described herein, there would be more swing on the bit lines in the array when the sense amplifier is amplified due to pulling on the bit lines that occur while they connect to the amplifier during this time.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit, comprising:
    a first pass gate transistor driven by a signal derived from a bit line true associated with a static random access memory (SRAM) cell;
    a second pass gate transistor driven by a signal derived from a bit line complement associated with the SRAM cell;
    a first pull down transistor driven by the signal derived from the bit line complement and coupled to the first pass gate transistor;
    a second pull down transistor driven by the signal derived from the bit line true and coupled to the second pass gate transistor;
    a data line true coupled to a node coupling the first pass gate transistor with the first pull down transistor, wherein the data line true is isolated from the bit line true by the first pass gate transistor;
    a data line complement coupled to a node coupling the second pass gate transistor with the second pull down transistor, wherein the data line complement is isolated from the bit line complement by the second pass gate transistor; and
    a current cut-off device that cuts off parasitic current from flowing through one of a first path formed from the first pass gate transistor and the first pull down transistor and a second path formed from the second pass gate transistor and the second pull down transistor.

2. The circuit according to claim 1, wherein the current cut-off device includes a bit line complement pull down transistor that is configured to pull down the signal derived from the bit line complement towards ground and a bit line true pull down transistor that is configured to pull down the signal derived from the bit line true towards ground.

3. The circuit according to claim 2, wherein an inverted data line complement drives the bit line complement pull down transistor and an inverted data line true drives the bit line true pull down transistor.

4. The circuit according to claim 1, further including a data line true inverter that inverts the data line true.

5. The circuit according to claim 4, further including a data line complement inverter that inverts the data line complement.

6. The circuit according to claim 5, further including a differential to single ended signal converter that receives data from the data line true inverter and the data line complement inverter as input and generates a single output therefrom.

7. The circuit according to claim 1, wherein the current cut-off device includes a first pass gate current cut-off transistor in series with the first pass gate transistor and a second pass gate current cut-off transistor in series with the second pass gate transistor, the first pass gate current cut-off transistor is configured to cut off current generated from a supply voltage to the first pass gate transistor and the second pass gate current cut-off transistor is configured to cut off current generated from the supply voltage to the second pass gate transistor.

8. The circuit according to claim 7, wherein an inverted data line true drives the first pass gate current cut-off transistor and an inverted data line complement drives the second pass gate current cut-off transistor.

9. The circuit according to claim 1, further comprising an isolation device configured to receive the signal derived from the bit line true and the signal derived from the bit line complement from the SRAM cell.

10. The circuit according to claim 9, wherein the isolation device includes a first pass transistor that passes the signal derived from the bit line true therethrough to drive the first pass gate transistor and a second pass transistor that passes the signal derived from the bit line complement therethrough to drive the second pass gate transistor, the first pass gate transistor and the second pass gate transistor operating in conjunction to reduce power on bit line true and bit line complement.

11. A sense amplifier for a static random access memory (SRAM) cell, comprising:
    a first pass transistor configured to pass data that is on a signal derived from a bit line true associated with the SRAM cell;
    a second pass transistor configured to pass data that is on a signal derived from a bit line complement associated with the SRAM cell;
    a first pass gate transistor configured to be driven by the data that is on the signal derived from the bit line true passing through the first pass transistor;
    a second pass gate transistor configured to be driven by the data that is on the signal derived from the bit line complement passing through the second pass transistor;
    a first pull down transistor driven by the data that is on the signal derived from the bit line complement and coupled to the first pass gate transistor;
    a second pull down transistor driven by the data that is on the signal derived from the bit line true and coupled to the second pass gate transistor;
    a data line true coupled to a node coupling the first pass gate transistor with first pull down transistor, wherein the data line true is isolated from the bit line true by the first pass gate transistor;
    a data line complement coupled to a node coupling the second pass gate transistor with the second pull down transistor, wherein the data line complement is isolated from the bit line complement by the second pass gate transistor; and
    a current cut-off device configured to cut off parasitic current from flowing through one of a first path formed from the first pass gate transistor and the first pull down transistor and a second path formed from the second pass gate transistor and the second pull down transistor during an amplification state.

12. The sense amplifier according to claim 11, wherein the current cut-off device includes a bit line complement pull down transistor that is configured to pull down the signal derived from the bit line complement towards ground and a bit line true pull down transistor that is configured to pull down the signal derived from the bit line true towards ground.

13. The sense amplifier according to claim 12, wherein an inverted data line complement drives the bit line complement pull down transistor and an inverted data line true drives the bit line true pull down transistor.

14. The sense amplifier according to claim 11, further including a data line true inverter that inverts the data line true.

15. The sense amplifier according to claim 14, further including a data line complement inverter that inverts the data line complement.

16. The sense amplifier according to claim 15, further including a differential to single ended signal converter that receives data from the data line true inverter and the data line complement inverter as input and generates a single output therefrom.

17. The sense amplifier according to claim 11, wherein the current cut-off device includes a first pass gate current cut-off transistor in series with the first pass gate transistor and a second pass gate current cut-off transistor in series with the second pass gate transistor, the first pass gate current cut-off transistor is configured to cut off current generated from a supply voltage to the first pass gate transistor and the second pass gate current cut-off transistor is configured to cut off current generated from the supply voltage to the second pass gate transistor.

18. The sense amplifier according to claim 17, wherein an inverted data line true drives the first pass gate current cut-off transistor and an inverted data line complement drives the second pass gate current cut-off transistor.

* * * * *